United States Patent [19]

Laub et al.

[11] Patent Number: 5,034,692
[45] Date of Patent: Jul. 23, 1991

[54] MAGNETIC RESONANCE IMAGING METHOD FOR ACQUIRING FLUX-COMPENSATED, $T_2$-WEIGHTED IMAGES

[75] Inventors: Gerhard Laub, Heroldsbach; Michael Deimling, Moehrendorf-Kleinseebach, both of Fed. Rep. of Germany

[73] Assignee: Siemens Aktiengesellschaft, Munich, Fed. Rep. of Germany

[21] Appl. No.: 484,380

[22] Filed: Feb. 23, 1990

[30] Foreign Application Priority Data

Feb. 24, 1989 [EP] European Pat. Off. .......... 89103293

[51] Int. Cl.$^5$ .......................................... G01R 33/20
[52] U.S. Cl. .......................................... 324/309
[58] Field of Search .............. 324/300, 307, 308, 309, 324/310, 311, 312, 313, 314, 318, 322

[56] References Cited

U.S. PATENT DOCUMENTS

| | | | |
|---|---|---|---|
| 4,706,024 | 11/1987 | Dumoulin | 324/309 |
| 4,728,933 | 3/1988 | Feinberg | 324/312 |
| 4,752,734 | 6/1988 | Wedeen | 324/306 |
| 4,766,382 | 8/1988 | Ohuchi | 324/312 |
| 4,780,675 | 10/1988 | Demeester | 324/312 |
| 4,800,889 | 1/1989 | Dumoulin | 128/653 R |
| 4,849,697 | 7/1989 | Cline | 324/306 |
| 4,851,779 | 7/1989 | Bearden | 324/312 |
| 4,912,413 | 3/1990 | Demeester | 324/312 |
| 4,918,386 | 4/1990 | Cline et al. | 324/309 |

FOREIGN PATENT DOCUMENTS 0098479 6/1983 European Pat. Off. .

OTHER PUBLICATIONS

"An Analysis of Fast Imaging Sequences with Steady-State Transverse Magnetization Refocusing", Zur et al., Mag. Res. Med., vol. 6, pp. 175-193, (1988).
"MR Angiography with Gradient Motion Refocusing", Laub et al., J. Comp. Assist. Tomog., vol. 12, No. 3, pp. 377-382, (1988).
"Fast SSFP Gradient Echo Sequence for Simultaneous Acquisitions of FID and Echo Signals", Lee et al., Mag. Res. Med., vol. 8, pp. 142-150, (1988).
"A New Steady-State Imaging Sequence for Simultaneous Acquisition of Two MR Images with Clearly Different Contrasts", Bruder et al., Mag. Res. Med., vol. 7, pp. 35-42, (1988).

*Primary Examiner*—Michael J. Tokar
*Attorney, Agent, or Firm*—Hill, Van Santen, Steadman & Simpson

[57] ABSTRACT

A method for obtaining an image in a magnetic resonance imaging apparatus uses a steady state pulse sequence which is based on a combination of a FISP pulse sequence and a PSIF pulse sequence. To signals are obtained by executing a sequence of steps once with alternating phase relation of the RF pulses, which excite the nuclear spins, and once with non-altering phase relation. By subtracting these signals, a pure PSIF signal is obtained, and the steady state is not disturbed by the moving spins. The flux phase is also compensated by the additional introduction of gradient motion refocusing (GMR) pulses, so that images of pulsating examination subjects, such as cerebral spin fluid, can be obtained free of flux artifacts.

5 Claims, 3 Drawing Sheets

MAGNETIC RESONANCE IMAGING METHOD FOR ACQUIRING FLUX-COMPENSATED, T₂-WEIGHTED IMAGES

BACKGROUND OF THE INVENTION

The present invention is directed to a method for obtaining images by magnetic resonance imaging.

2. DESCRIPTION OF THE PRIOR ART

The following pulse sequence is described in the article entitled: "A New Steady-State Imaging Sequence for Simultaneous Acquisition of Two MR Images with Clearly Different Contrasts," Bruder et al., Magnetic Resonance in Medicine, Vol. 7, pages 35–42 (1988):

(a) In a time interval $T_R < T_2$, RF pulses are generated in the z-direction with the simultaneous generation of a gradient $G_z$. A magnetization condition which is known as SSFP (steady state free precession) thereby arises.

(b) An inverted gradient pulse $G_z$, is generated in the z-direction before and after each RF pulse.

(c) A gradient $G_y$ in the y-direction and a gradient $G_x$ in the x-direction are generated before and after each RF pulse.

(d) Two gradients in the x-direction are symmetrically activated between two RF pulses, with a signal being read out under each of the two gradients.

(e) The above sequence (a)–(d) is repeated n times, with the time integral of the gradient $G_y$ being varied in equidistant steps.

(f) The signal which has been read out is sampled, and two images having different $T_2$ contrast are reconstructed from the sampled measured values.

The above method combines a FISP sequence and a sequence which is mirror-symmetrical to the FISP sequence (referred to below as the PSIF sequence) into a singe pulse sequence, whereby two images having highly different $T_2$ contrast are obtained.

PSIF sequences are especially useful for measuring $T_2$-weighted images. This is of particular significance for the display of CSF (cerebral spinal fluid) in the head and in the spinal column. CSF, however, exhibits a pulsating motion, so that pulsation artifacts are present in the image obtained using the PSIF sequence.

SUMMARY OF THE INVENTION

It is an object of the present invention to provide a pulse sequence based on the principle of steady state free precession (SSFP) from which an image can be constructed which is substantially free of motion artifacts.

The above object is achieved in accordance with the principles of the present invention in a method wherein an examination subject, disposed in a fundamental static magnetic field, is subjected to a plurality of radio frequency pulses at a pulse repetition interval which is less than the $T_2$ relaxation time. The radio frequency pulses excite nuclear spins in the examination subject, and thereby generate magnetic resonance signals. A magnetic gradient field pulse is generated in the y-direction before and after each radio frequency pulse. Each of these gradient pulses in the y-direction is graphically representable as a curve having an area beneath the curve, and the respective gradient pulses in the y-direction before and after each radio frequency pulse have respective areas associated therewith which sum to zero. A magnetic field gradient pulse is generated in the x-direction chronologically symmetrically between two of the radio frequency pulses. Preceding and following each of the gradient pulses in the x-direction, an inverted magnetic gradient field pulse is generated, also in the x-direction but having a polarity opposite to the chronologically symmetrical x-direction pulse. The chronologically symmetrical gradient pulse and the inverted gradient pulses in the x-direction in combination have a time integral which is equal to zero. The magnetic resonance signals are read out during the gradient in the x-direction. The above steps are repeated a first n times with the radio frequency pulses for each repetition having the same phase relation, and with the time integral of the gradient pulses in the y-direction being varied in chronologically equidistant steps for each repetition. A magnetic resonance signal is thus obtained for each of the first n repetitions. Those same steps are then repeated a second n times, with the phase relation of the radio frequency pulses alternating by 180° from repetition-to-repetition, and with the time integral of the gradients in the y-direction being varied in chronologically equidistant steps for each repetition. A magnetic resonance signal is thus also obtained for each of the second n repetitions. The magnetic resonance signals respectively obtained as a result of the first and second n repetitions are then added to obtain a first data set, and are subtracted to obtain a second data set. The image of the examination subject is then reconstructed from the first and second data sets.

DESCRIPTION OF THE PREFERRED EMBODIMENTS

Figure 1:
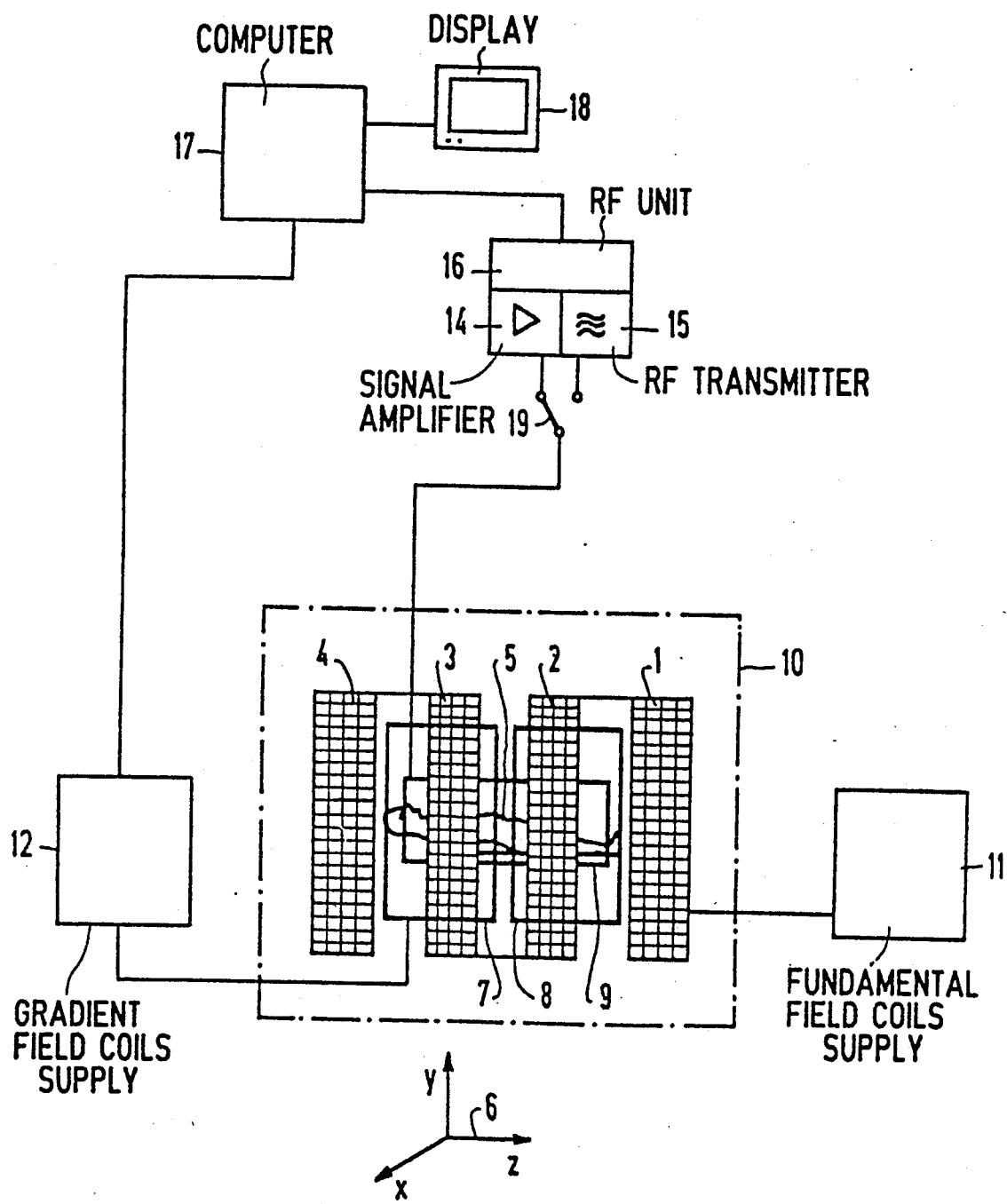
FIG. 1 is a schematic block diagram of a magnetic resonance imaging apparatus in which a method in accordance with the principles of the present invention can be used to generate an image.

The basic components of a conventional nuclear magnetic resonance tomography apparatus, in which the method disclosed herein can be employed, are shown in FIG. 1. The apparatus includes coils 1, 2, 3 and 4 which generate a fundamental magnetic field in which an examination subject 5 is disposed, for example, to obtain an image for medical diagnostic purposes. Orthogonal sets of gradient coils are also provided which generate independent, orthogonal magnetic field components in the x-, y- and z-direction, according to the coordinate axes 6. For clarity, only the gradient coils 7 and 8 are shown in FIG. 1, which generate an x-gradient in combination with a pair of identical gradient coils on the opposite side of the patient 5. Sets of y-gradient coils (not shown) are disposed above and below and parallel to the patient 5. Sets of z-gradient coils (not shown) are disposed at the head and the feet of the patient 5, transversely relative to the longitudinal axis of the patient 5. A radio frequency (RF) coil 9 is also provided, which is used to generate the nuclear magnetic resonance signals in the patient 5, as well as to pick-up those signals. The coils 1, 2, 3, 4, 7, 8 and 9, bounded by a dot-dash line 10, constitute the actual examination instrument.

The examination instrument is operated by an electrical arrangement which includes a power supply 11 for the fundamental field coils 1 through 4, and a gradient coils power supply 12 for operating the gradient coils 7 and 8 and the other gradient coils. The radio frequency coil 9 is coupled to a control computer 17 via a signal amplifier 14 in a signal reception mode, and via a radio frequency transmitter 15 in a signal transmitting mode. The components 14 and 15 form a radio frequency unit 16. A switch 19 enables switching from the transmission to the reception mode. The control computer 17, in addition to controlling operation of the apparatus, is supplied with the signals picked-up by the radio frequency coil 9, and constructs an image from those signals which is shown on a display 18.

Figure 2:
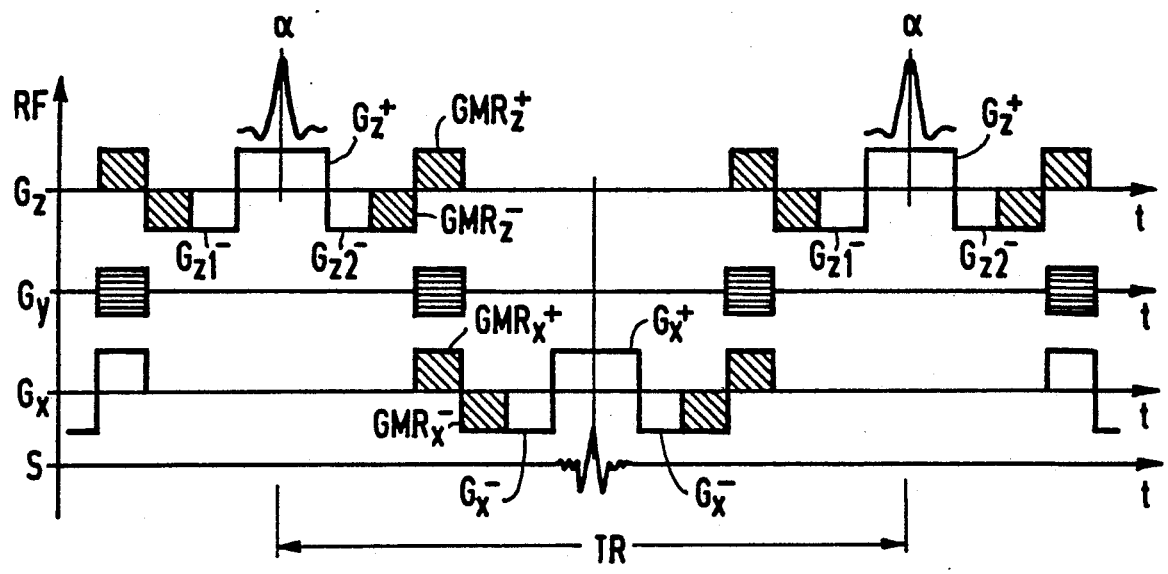
FIG. 2 shows the sequence of RF and gradient pulses in a first embodiment in accordance with the principles of the present invention.

An exemplary embodiment of a pulse sequence for explaining the inventive method is shown in FIG. 2. The pulse sequence will be first discussed without the hatched pulses, which are for gradient motion refocusing (GMR). Nuclear spins in the examination subject 5 are excited by a sequence of radio frequency pulses RF having a flip angle o. The repetition time $T_R$ of the radio frequency pulses RF is shorter than the relaxation time $T_2$, so that a steady state magnetization is established. In the exemplary embodiment, a gradient $G_z^+$, in the z-direction is generated simultaneously with each radio frequency pulse RF, so that only the spins in one slice of the examination subject 5 are selectively excited.

A critical condition for achieving the steady state magnetization condition, even given moving spins, is that the integral over the gradients in the respective direction is zero over the entirety of a pulse sequence. A negative gradient $G_{z1}^{31}$ or $G_{z2}^{31}$ is therefore generated before and after each gradient $G_z^{30}$, the negative gradients $G_{z1}^-$ and $G_{z2}^-$ having a shape corresponding to the shape of the gradient $G_z^+$. A gradient $G_y$ is generated before and after each negative gradient $G_{z2}^{31}$ and before each radio frequency pulse RF, but not during the readout phase of the signal S. The gradient $G_y$ acts as a phase coding gradient and is varied between a negative value and a positive value from pulse sequence-to-pulse sequence in equidistant steps. The modification of two successive phase coding gradients $G_y$ ensues in the opposite direction, so that the area beneath the curves of these two gradients is zero. A gradient $G_x^+$ is generated equidistantly between two radio frequency pulses RF, and the nuclear magnetic resonance signal S is read out under the influence of this gradient $G_x^+$. To have the time integral over the gradient be zero in the x-direction as well, a negative gradient $G_x^-$ is generated before and after the gradient $G_x^+$.

The above pulse sequence is repeated n times, with the gradient $G_y$, functioning as a phase coding gradient, being varied in an equidistant step for each repetition. The signal S is sampled and converted into digital form, and m samples per sequence are entered into a row of an n x m matrix. An image of the spin density distribution in the selected slice of the examination subject can be produced using this matrix by a two-dimensional Fourier transformation.

If only the second half of the above sequence is considered, this is basically a PSIF sequence (i.e., a mirrored FISP sequence), as described in the aforementioned Magnetic Resonance in Medicine article. As was noted earlier, this PSIF sequence would be of particular interest for the portrayal of CSF due to the significant $T_2$-dependency.

The PSIF sequence is based on the generation of a steady state magnetization in both the longitudinal and transverse directions, as arises due to the RF pulses which rapidly follow one another. As noted above, however, CSF exhibits pulsation phenomena. Due to the pulsating motion of spins given the presence of the magnetic field gradients necessary for the imaging, the transverse component of the magnetization is varied dependent on the velocity of the spins. The establishment of a steady state magnetization therefore cannot be obtained for a chronologically non-constant motion. Using conventional pulse sequences, therefore, the display of CSF exhibits image artifacts in the form of signal losses and/or ghost images due to the motion of the spins. These are known as flux artifacts.

In order to avoid such flux artifacts, the pulse sequence explained above was developed so that the area integral of the gradients is zero over TR. To that end, the PSIF sequence (the right half of the sequence) was supplemented by FISP sequence (left half of the sequence). A combination of the FISP sequence and PSIF sequence was suggested in the aforementioned Magnetic Resonance in Medicine article. As proposed therein, however, two separate signals, i.e., a FISP signal and a PSIF signal were generated, and the area integral is not zero over the x-gradients.

Figure 3:
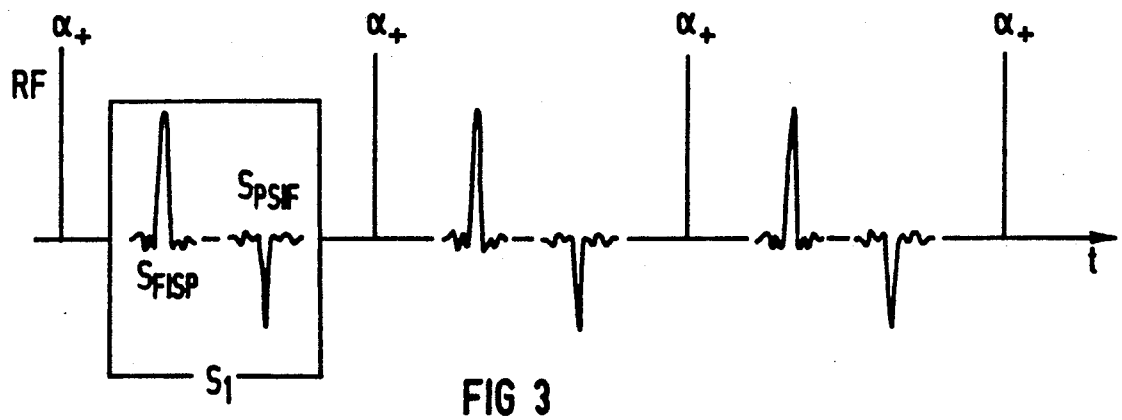
FIGS. 3 and 4 respectively show the signals obtained in accordance with the principles of the present invention.
Figure 4:
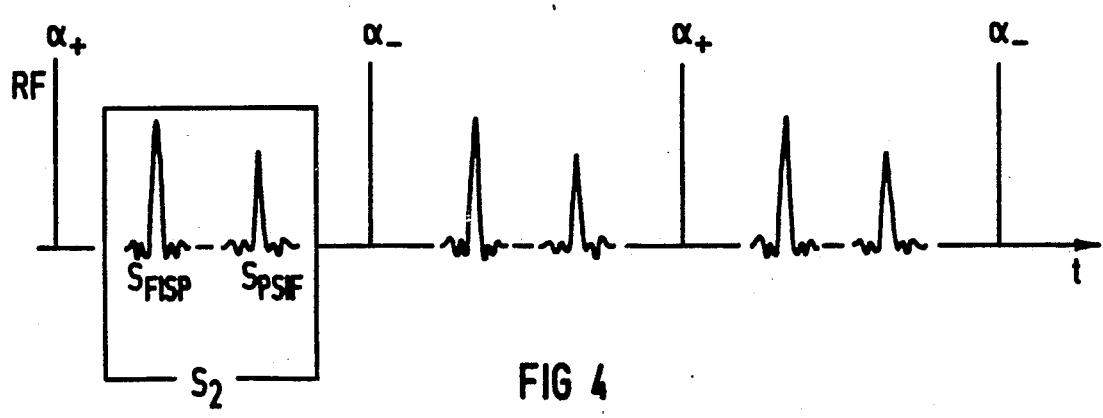

In the pulse sequence in accordance with the principles of the inventive method shown in FIG. 2, by contrast, the FISP and PSIF sequences are "pushed together" to such an extent that the gradient $G_x^+$ of the FISP sequence and of the PSIF sequence is shared. The integral of the x-direction gradients can thus be made to equal zero, i.e., $\int G_x(t)dt = 0$. Two signal components (FISP and PSIF) which are chronologically superimposed, however, necessarily arise. Due to the different sensitivity of both echoes to local magnetic field inhomogeneities (caused by inhomogeneities in the fundamental magnetic field and/or susceptibility differences in the examination subject), it is fundamentally not possible to make both echoes identical. Consequently, artifacts in the form of interference lines always arise in the reconstructed image. The avoidance of flux artifacts is thus achieved without further measures, but in so doing the artifacts in the form of interference lines between the FISP and PSIF signals arise. In order to resolve this problem, use was made of the fact that the signal components $S_{FISP}$ and $S_{PSIF}$ react differently to the application of phase-alternating and non-phase-alternating RF pulses. This is schematically indicated in FIGS. 3 and 4. In FIG. 3, the RF pulses are generated having the same flip angle and the same phase relation, indicated by $\alpha$. The signal components $S_{FISP}$ and $S_{PSIF}$, which are in fact superimposed, are shown separately in FIG. 3 for illustration, with the total signal being referred $S_1$.

FIG. 4 shows the RF pulse sequence wherein the phase relation of the RF pulses is changed by 180° from sequence-to-sequence, i.e., a phase alternation of the RF pulses in present. The RF pulses having the flip angle $\alpha$ and rotated by 180° are referenced $\alpha$ in FIG. 4. The signal components $S_{FISP}$ and $S_{PSIF}$ which arise as a result of this sequence are shown separately in FIG. 4, but are in fact superimposed, with the overall signal being referenced $S_2$. (The inversion of the received signal after each $\alpha_-$pulse, which is undertaken in the evaluation circuit, is already taken into consideration in the representation of FIG. 4.)

A comparison of FIGS. 3 and 4 shows that, even a phase alternation of the RF pulses, the phase relation of the PSIF signal component $S_{PSIF}$ is rotated by 180° in comparison to the sequence having RF pulses which do not alternate in phase. The following relationship is present:

$$S_1 = S_{FISP} - S_{PSIF}$$

$$S_2 = S_{FISP} + S_{PSIF}.$$

On the basis of this relationship, the FISP or PSIF signals can be identified from the two measurements, by addition or subtraction of the data sets according to the following equations:

$$S_{FISP} = (S_1 + S_2)/2$$

$$S_{PSIF} = (S_1 - S_2)/2.$$

FISP or PSIF images without interference can be acquired in this manner, and it is simultaneously assured that the area integral becomes zero over the gradient course in a sequence, and thus spin movements do not disturb the establishment of a steady state.

To the extent described thus far, i.e., without the gradient contributions shown hatched in FIG. 2, the following is valid for sequence:

$$\int_0^{T_R} G \cdot t \, dt \neq 0.$$

The flux phase $\phi_{vel}$ is thus unequal to zero because of the following relationship:

$$\phi_{vel}(t) = \gamma \cdot v \int_0^{T_R} G \cdot t \, dt \neq 0,$$

wherein v is the flux velocity.

A method known as GMR (gradient motion refocusing) for making the flux phase, i.e., the integral $\int G \cdot dt$, equal to zero is described in the article "MR Angiography with Gradient Motion Refocusing," Laub et al., Journal of Computer Assisted Tomography, Vol. 12, No. 3, (1988) at pages 377-382. This method can be incorporated in the inventive method disclosed herein as indicated by the hatched gradient pulses referenced GMR in the pulse sequence of FIG. 2. Each negative gradient in the z-direction ($G_{z1}$ and $G_{z2}$) is supplemented by a GMR gradient in the same direction and of the same polarity ($GMR_z^-$). To further satisfy the condition that the integral be zero over the gradient $G_z$, equal area gradient pulses $GMR_z^+$ follow the negative gradient pulses $GMR_z^-$.

The negative gradients $G_x^-$ in the x-direction are also supplemented in equivalent fashion by GMR gradients $GMR_x^-$ in the same direction and having the same polarity. Equal area, positive gradient pulses $GMR_x^+$ also follow these negative gradient pulses $GMR_z^-$.

Such GMR pulses can also be used in the y-direction. This is not shown in the exemplary embodiment of FIG. 2, because the flux phases in the phase coding direction are generally small.

The two conditions $$\int_0^{T_R} G \cdot t \, dt \neq 0 \text{ and } \int_0^{T_R} G \, dt = 0$$

are then satisfied with this pulse sequence. Under these conditions, the moving spins do not disturb the establishment of the steady state nor cause flux phases. The acquired images are thus substantially free of motion artifacts. Interferences due to the signal components are also avoided in the manner described above.

The pulse sequence for two-dimensional imaging with a preselected slice shown in FIG. 2 can be expanded to a pulse sequence for three-dimensional imaging.

Figure 5:
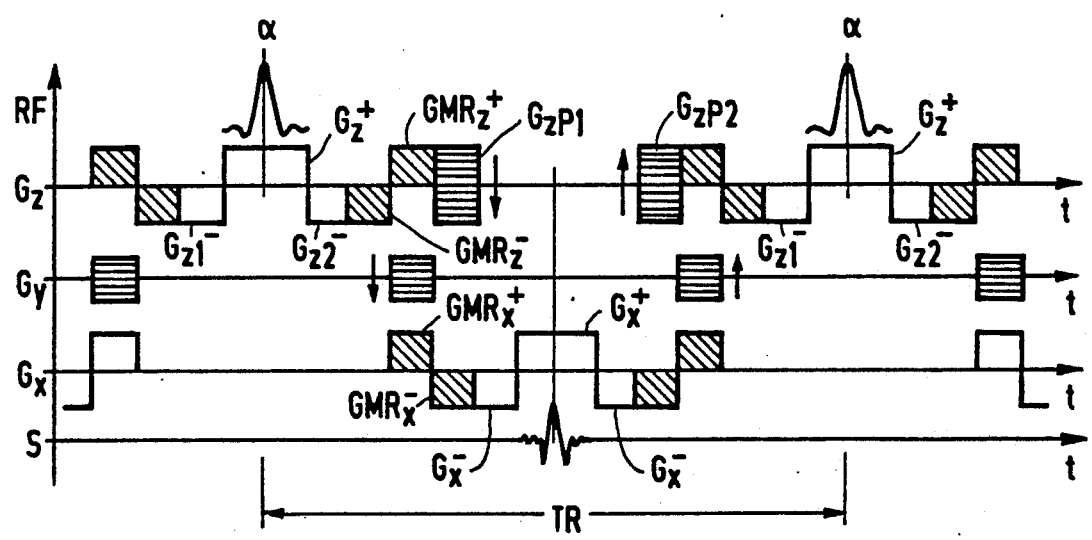
FIG. 5 shows the sequence of RF and gradient pulses in a second embodiment in accordance with the principles of the present invention.

Such a pulse sequence is shown in FIG. 5. The pulse sequence of FIG. 5 differs from the pulse sequence of FIG. 2 in that two phase coding gradients $G_{zP1}$ and $G_{zP2}$ are additionally inserted before and after the readout phase of the signal S. A broader slice, within which a topical resolution takes place by phase coding with the gradients $G_{zP1}$ and $G_{zP2}$, is thereby selected with the RF pulses and with the gradients $G_z^{30}$. The overall pulse sequence shown in FIG. 2 is then implemented n' times, with the gradients $G_{zP1}$ and $G_{zP2}$ being varied in equidistant steps with each repetition. The modification of these gradients also occurs in the opposite direction, so that an area sum equal to zero results. A signal is thus obtained that is phase-coded in both the z-direction and the y-direction. If m measured values are sampled for each sequence, a data set in the form of an n x n' x m matrix is obtained, i.e., a three-dimensional matrix. A three-dimensional image can then be acquired by three-dimensional Fourier transformation.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for obtaining an image in a nuclear magnetic resonance imaging apparatus comprising the steps of:

(a) disposing an examination subject in a fundamental static magnetic field;

(b) subjecting said examination subject in said fundamental magnetic field to a plurality of radio frequency pulses at a pulse repetition interval $T_r$ which is less than the $T_2$ relaxation time, said radio frequency pulses exciting nuclear spins in said examination subject and thereby generating magnetic resonance signals;

(c) generating a magnetic gradient field pulse in the y-direction before and after each radio frequency pulse, each gradient pulse in the y-direction being graphically representable as a curve with an area beneath said curve, and the respective gradient pulses in the y-direction before and after a radio frequency pulse having respective areas associated therewith which sum to zero;

(d) generating a magnetic gradient field pulse in the x-direction chronologically symmetrically between two of said radio frequency pulses and preceding and following said gradient pulse in the x-direction with inverted magnetic field gradient pulses in the x-direction having a polarity opposite to said gradient in the x-direction, said gradient pulse and said inverted gradient pulses in the x-direction in combination having a time integral equal to zero;
(e) reading out said magnetic resonance signals during said gradient in the x-direction;
(f) repeating steps (b), (c), (d) and (e) a first n times with the radio frequency pulses in each repetition having the same phase relation and varying the time integral of the gradient pulses in the y-direction in a chronologically equidistant step for each repetition, thereby obtaining a read-out magnetic resonance signal for each of the first n repetitions;
(g) repeating steps (b), (c), (d) and (e) a second n times alternating the phase relation of the radio frequency pulses by 180° from repetition-to-repetition and varying the time integral of the gradients in the y-direction in a chronologically equidistant step for each repetition, thereby obtaining a read-out magnetic resonance signal for each of the second n repetitions;
(h) adding said magnetic resonance signals obtained in steps (f) and (g) to obtain a first data set;
(i) subtracting said magnetic resonance signals obtained in steps (f) and (g) to obtain a second data set; and
(j) reconstructing an image of said examination subject from said first and second data sets.

2. A method as claimed in claim 1, comprising the additional step of:
generating a magnetic gradient pulse in the z-direction simultaneously with each radio frequency pulse for selecting a slice of said examination subject for imaging and respectively preceding and following said gradient pulse in the z-direction with inverted magnetic gradient pulses in the z-direction having a polarity opposite to said gradient pulse in the z-direction, with the time integral of said gradient pulse and said inverted gradient pulses in the z-direction being zero.

3. A method as claimed in claim 2, comprising the additional step of:
generating respective further gradient pulses before and after each of said gradient pulses and inverted gradient pulses in the x-direction and said gradient pulses and inverted gradient pulses in the z-direction, each further gradient consisting of a positive part and a negative part with the time interval over each further gradient being zero.

4. A method as claimed in claim 1, comprising the additional step of:
generating respective further gradient pulses before and after each of said gradient pulses and inverted gradient pulses in the x-direction, each further gradient pulse having a positive part and a negative part with the time interval over each further gradient being zero.

5. A method as claimed in claim 1, comprising the additional steps of:
generating respective gradient pulses in the z-direction before and after each radio frequency pulse; and
repeating steps (b), (c), (d), (e), (f), (g), (h) and (i) n' times and varying the time integral of said gradient pulses in the z-direction in a chronologically equidistant step in alternating opposite directions respectively for each of said n' repetitions.

* * * * *